United States Patent [19]
Gardner et al.

[11] Patent Number: 5,851,893
[45] Date of Patent: Dec. 22, 1998

[54] METHOD OF MAKING TRANSISTOR HAVING A GATE DIELECTRIC WHICH IS SUBSTANTIALLY RESISTANT TO DRAIN-SIDE HOT CARRIER INJECTION

[75] Inventors: Mark I. Gardner, Cedar Creek; H. Jim Fulford, Jr., Austin, both of Tex.

[73] Assignee: Advanced Micro Devices, Inc.

[21] Appl. No.: 896,680

[22] Filed: Jul. 18, 1997

[51] Int. Cl.[6] ............................................. H01L 21/336
[52] U.S. Cl. ........................................ 438/305; 438/910
[58] Field of Search .................................. 438/288, 305, 438/306, 307, 910

[56] References Cited

U.S. PATENT DOCUMENTS

| | | | |
|---|---|---|---|
| 5,464,792 | 11/1995 | Tseng et al. | 438/910 |
| 5,552,332 | 9/1996 | Tseng et al. | 438/910 |
| 5,674,788 | 10/1997 | Wristers et al. | 438/910 |
| 5,744,371 | 4/1998 | Kadosh et al. | 438/305 |

*Primary Examiner*—Chandra Chaudhari
*Attorney, Agent, or Firm*—Kevin L. Daffer; Conley, Rose & Tayon

[57] ABSTRACT

A transistor fabrication process is provided which derives a benefit from having barrier atoms incorporated in a lateral area under a gate oxide of the transistor in close proximity to the drain. To form the transistor, a gate oxide layer is first grown across a silicon-based substrate. A polysilicon layer is then deposited across the gate oxide layer. Portions of the polysilicon layer and the oxide layer are removed to form a gate conductor and gate oxide, thereby exposing source-side and drain-side junctions within the substrate. An LDD implant is performed to lightly dope the source-side and drain-side junctions. An etch stop material may be formed upon opposed sidewall surfaces of the gate conductor, the upper surface of the gate conductor, and the source-side and drain-side junctions. Spacers may then be formed laterally adjacent the etch stop material located upon sidewall surfaces of the gate conductor. The unmasked portions of the source-side and drain-side junctions are heavily doped, resulting in source and drain regions that are aligned to the exposed lateral edges of the spacers. The drain-side spacer is removed and barrier atoms are forwarded through the exposed etch stop material and into a substrate/gate oxide interface region near the drain junction. The barrier atoms help reduce hot electron effects by blocking diffusion avenues of carriers (holes or electrons) from the drain-side junction into the gate oxide.

13 Claims, 6 Drawing Sheets

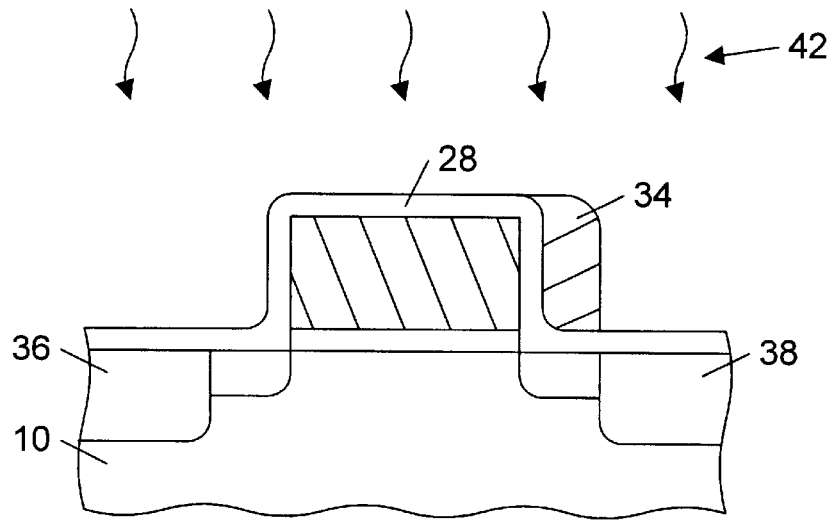
FIG. 8A
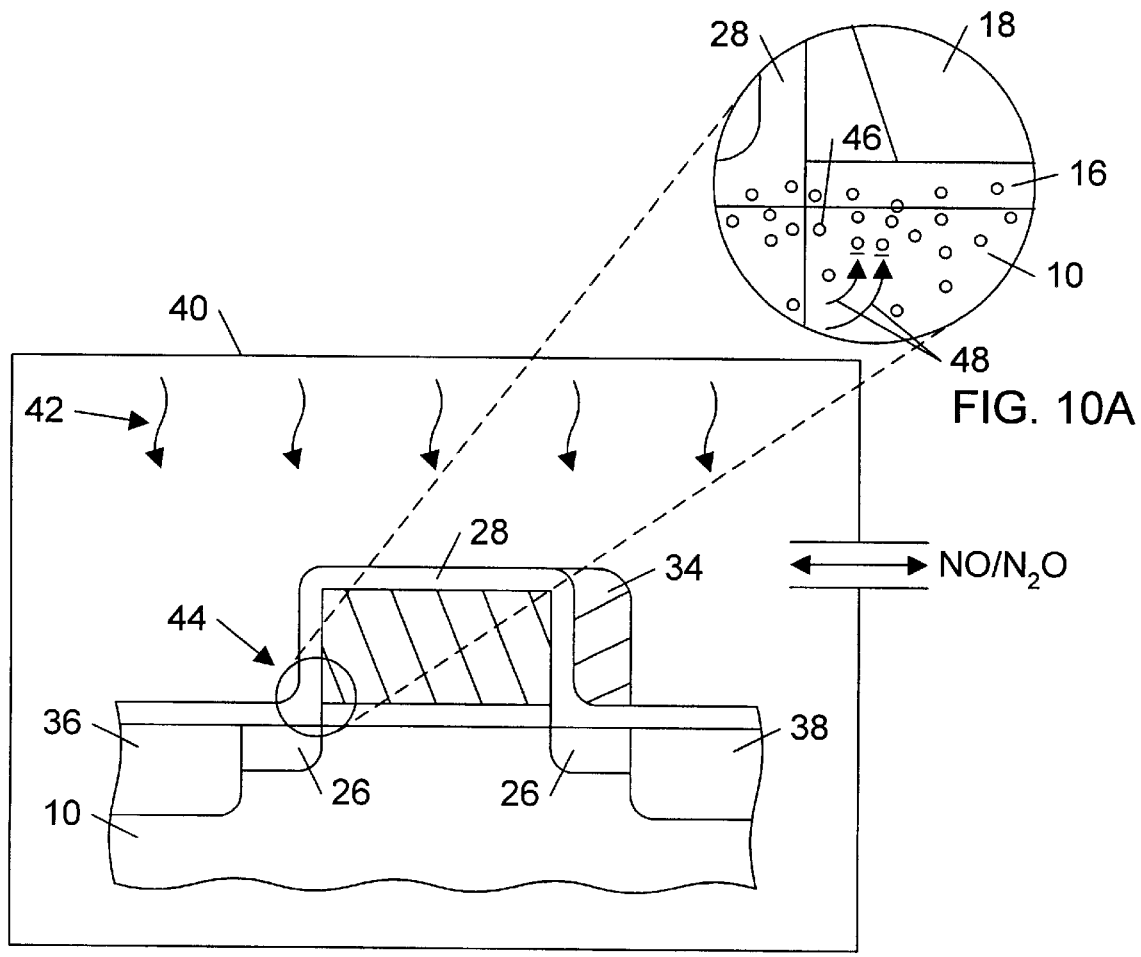
FIG. 9A
FIG. 10A

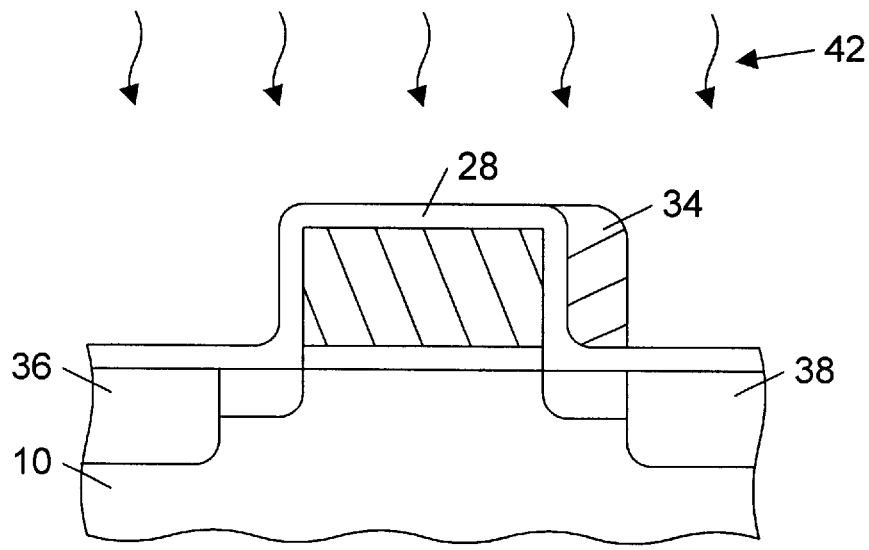
FIG. 8C
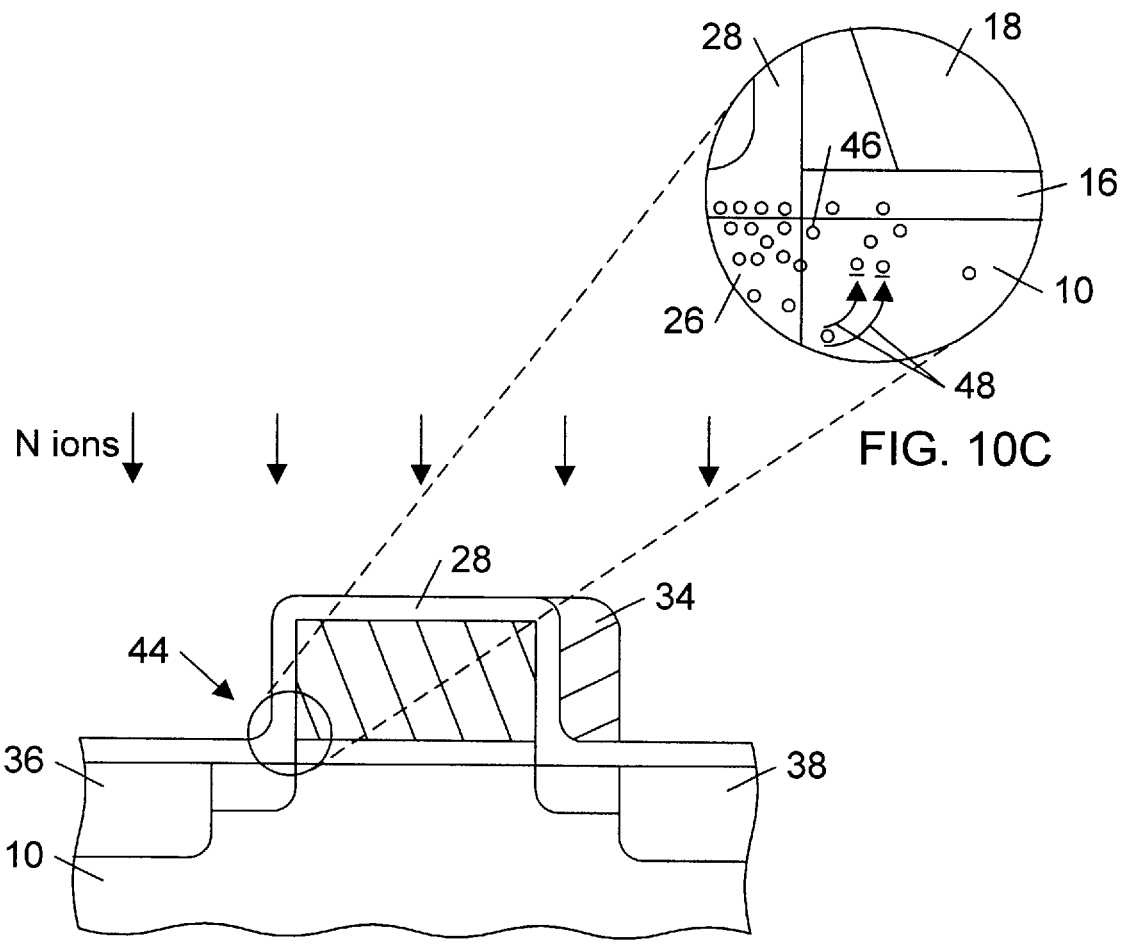
FIG. 9C
FIG. 10C

METHOD OF MAKING TRANSISTOR HAVING A GATE DIELECTRIC WHICH IS SUBSTANTIALLY RESISTANT TO DRAIN-SIDE HOT CARRIER INJECTION

BACKGROUND OF THE INVENTION

1. Field of the Invention

This invention relates to the manufacture of an integrated circuit and more particularly to the formation of an n-channel and/or p-channel transistor having barrier atoms incorporated in a lateral area under the drain-side of a gate dielectric to enhance transistor performance.

2. Description of the Related Art

Fabrication of a MOSFET device is well known. Generally speaking, MOSFETs are manufactured by placing an undoped polycrystalline ("polysilicon") material over a relatively thin gate oxide. The polysilicon material and gate oxide is then patterned to form a gate conductor with source/drain regions adjacent to and on opposite sides of the gate conductor. The gate conductor and source/drain regions are then implanted with an impurity dopant material. If the impurity dopant material used for forming the source/drain regions is n-type, then the resulting MOSFET is an NMOSFET ("n-channel") transistor device. Conversely, if the source/drain dopant material is p-type, then the resulting MOSFET is a PMOSFET ("p-channel") transistor device.

Integrated circuits utilize either n-channel devices exclusively, p-channel devices exclusively, or a combination of both on a single substrate. While both types of devices can be formed, the devices are distinguishable based on the dopant species used. The methods by which n-channel devices and p-channel devices are formed entail unique problems associated with each device. As layout densities increase, the problems are exacerbated. N-channel devices are particularly sensitive to so-called short-channel effects ("SCE"). The distance between a source-side junction and a drain-side junction is often referred to as the physical channel length. However, after implantation and subsequent diffusion of the junctions, the actual distance between junctions becomes less than the physical channel length and is often referred to as the effective channel length ("Leff"). In VLSI designs, as the physical channel becomes small, so too must the Leff. SCE becomes a predominant problem whenever Leff drops below approximately 1.0 $\mu$m.

A problem related to SCE and the subthreshold currents associated therewith, but altogether different, is the problem of hot-carrier effects ("HCE"). HCE is a phenomena by which the kinetic energy of the carriers (holes or electrons) is increased as they are accelerated through large potential gradients and subsequently become trapped within the gate oxide. The greatest potential gradient, often referred to as the maximum electric field ("Em") occurs near the drain during saturated operation. More specifically, the electric field is predominant at the lateral junction of the drain adjacent the channel. The electric field at the drain primarily causes electrons in the channel to gain kinetic energy and become "hot".

As hot electrons travel to the drain, they lose their energy by a process called impact ionization. Impact ionization serves to generate electron-hole pairs, wherein the pairs migrate to and become injected within the gate dielectric near the drain junction. Traps within the gate dielectric generally become electron traps, even if they are partially filled with holes. As a result, there is a net negative charge density in the gate dielectric. The trapped charge accumulates with time, resulting in a positive threshold shift in the NMOS transistor, or a negative threshold shift in a PMOS transistor. It is known that since hot electrons are more mobile than hot holes, HCE causes a greater threshold skew in NMOS transistors than PMOS transistors. Nonetheless, a PMOS transistor will undergo negative threshold skew if its Leff is less than, e.g., 0.8 $\mu$m.

It is therefore desirable to develop a technique for fabricating transistors with reduced hot carrier injection into and trapping within the drain-side of a gate dielectric. Such a fabrication technique is necessary to prevent the accumulation of trapped charge within a gate dielectric, which would further help prevent the threshold voltage of a transistor from varying from its design specification. Since several types of semiconductor devices rely on the stability of transistor threshold voltage, uniformity of threshold voltage is desirable. The presence of a highly uniform and stable threshold voltage would provide for a highly reliable integrated circuit.

SUMMARY OF THE INVENTION

The problems outlined above are in large part solved by the improved method hereof for forming a p-channel or an n-channel transistor. That is, the present process involves incorporating barrier atoms into a lateral area underneath the drain-side of the gate oxide to abate HCE that result from hot carrier injection into the drain-side of the gate conductor.

So that barrier atoms may only be incorporated into the drain-side of the gate conductor, the drain-side spacer is removed while the source-side spacer is left behind to inhibit barrier atoms from migrating into an area underneath the source-side of the gate conductor. A sacrificial material may be formed between the gate conductor and the spacers on opposite sides of the gate conductor. The purpose of the sacrificial material is to allow the drain-side spacer to be selectively etched away without removing any portion of the gate oxide. Thus, the sacrificial material is preferably different in composition from the spacer material.

After the removal of the drain-side spacer, barrier atoms or ions may be compelled to traverse through the sacrificial material, i.e., "etch stop layer", and into vacancies and opportune bond sites within and underneath a drain-side area of the gate oxide. The improvement in hot-carrier reliability is mainly attributed to the presence of barrier atoms at the interface between the silicon substrate and the gate oxide (i.e., the Si/SiO$_2$ interface), particularly in proximity to the drain. Thus, a majority of high-energy carriers (electrons or holes) cannot migrate into the gate oxide since barrier atoms occupy a substantial portion of the migration avenues at the substrate/oxide interface. Further, charge carrier trapping of electrons that escape into the gate oxide is limited because, e.g., strong Si-N bonds exist in place of weaker Si-H and strained Si-O bonds. Nitrogen atoms are preferably used as barrier atoms, however, it is not necessary the barrier atoms be limited exclusively to nitrogen.

Preferably, barrier atoms are strategically placed only in the critical area near the drain-side of the gate oxide. Barrier atoms thusly placed do not adversely affect the source-side of the transistor. It is postulated that barrier atoms unnecessarily positioned in vacancies within the channel may cause the output current, $I_D$, of the transistor to undesirably decrease such that optimum device performance is unattainable. Output current may decrease because the barrier atoms occupy interstitial positions within the silicon crystal lattice, thereby deterring carrier mobility. In other words, the pathways that provide mobility for electrons and holes are blocked.

In an embodiment of the present invention, a gate oxide is thermally grown within and upon an upper surface of a silicon-based substrate. A layer of polysilicon is then deposited across the oxide layer. Portions of the oxide layer and the polysilicon layer may be removed to form a gate conductor interposed between an exposed pair of silicon substrate regions (henceforth referred to as source-side and drain-side junctions). The source-side and drain-side junctions are implanted with a dopant to form LDD areas therein. An etch stop material, such as a grown or deposited oxide may be formed upon opposed sidewall surfaces of the gate conductor, the upper surface of the gate conductor, and the source-side and drain-side junctions.

Spacers may then be formed laterally adjacent the etch stop material located upon sidewall surfaces of the gate conductor. The spacers are made from a different material than the etch stop material. For instance, nitride spacers may be used. The combined lateral thickness of the spacers and the etch stop material extending from the sidewall surfaces mask select portions of the source-side and drain-side junctions. The unmasked portions of the source-side and drain-side junctions are then heavily doped, resulting in source and drain regions that are aligned to the exposed lateral edges of the spacers. Since the etch stop material is of different composition than the spacer, a wet etch may be applied to remove the drain-side spacer in lieu of the etch stop material. Barrier atoms, such as nitrogen are driven through the exposed etch stop material and into the critical substrate/gate oxide interface region.

BRIEF DESCRIPTION OF THE DRAWINGS

Other objects and advantages of the invention will become apparent upon reading the following detailed description and upon reference to the accompanying drawings in which:

FIG. 8a is a cross-sectional view of the semiconductor topography, wherein the semiconductor topography is subjected to thermal radiation according to one embodiment, subsequent to the step in FIG. 7;

FIG. 9a is a cross-sectional view of the semiconductor topography, wherein the semiconductor topography is subjected to thermal radiation in an ambient containing barrier atoms, subsequent to the step in FIG. 8a;

FIG. 10a is a detailed view of section 44 of FIG. 9a, wherein an atomic view is presented illustrative of barrier atoms blocking the migration of charged carriers into the gate oxide during operation of the transistor;

FIG. 9b is a detailed view of section 44 of FIG. 8b, wherein an atomic view is presented illustrative of barrier atoms blocking the migration of charged carriers into the gate oxide during operation of the transistor.

FIG. 8c is a cross-sectional view of the semiconductor topography, wherein the semiconductor topography is subjected to thermal radiation according to one embodiment, subsequent to the step in FIG. 7.

FIG. 9c is a cross-sectional view of the semiconductor topography, wherein barrier ions are forwarded to the semiconductor topography, subsequent to the step in FIG. 8c.

FIG. 10c is a detailed view of section 44 of FIG. 9c, wherein an atomic view is presented illustrative of barrier atoms blocking the migration of charged carriers into the gate oxide during operation of the transistor.

Figure 1:
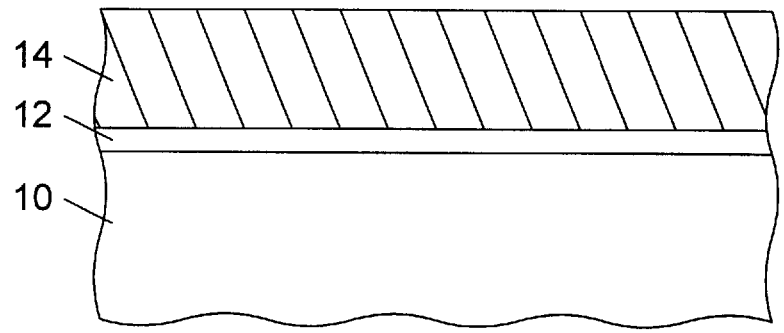
FIG. 1 is a cross-sectional view of a semiconductor topography, wherein an oxide layer is grown across a silicon substrate and a polysilicon layer is deposited across the oxide layer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning to FIG. 1, an oxide layer 12 is formed across a single crystalline silicon substrate 10. In one instance, oxide layer 12 may be formed by subjecting the silicon substrate to a gas having oxygen containing compounds, thereby promoting the growth of oxide layer 12 within and upon silicon substrate 10. Oxide layer 12 is primarily composed of silicon dioxide resulting from silicon atoms at the surface of substrate 10 bonding with the ambient oxygen atoms. A polysilicon layer 14 is then deposited across oxide layer 12. Polysilicon layer 14 is preferably formed by using chemical vapor deposition.

Figure 2:
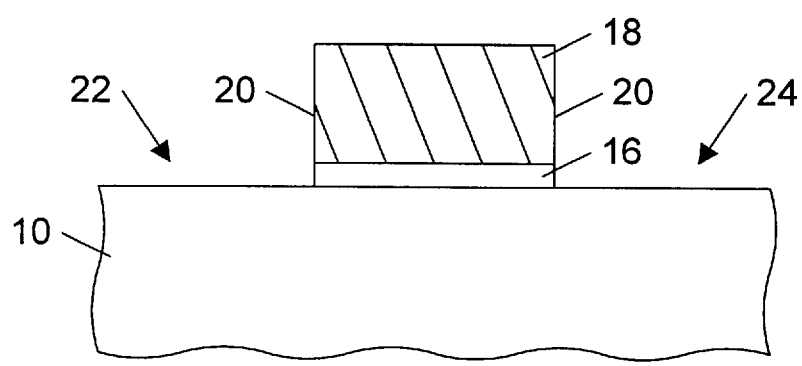
FIG. 2 is a cross-sectional view of the semiconductor topography, wherein portions of the oxide layer and the polysilicon layer are removed to form a gate oxide and a gate conductor interposed between a pair of junction areas embodied within the silicon substrate, subsequent to the step in FIG. 1.

FIG. 2 illustrates the formation of a gate conductor 18, a gate oxide 16, and exposed regions 22 and 24 of substrate 10. Portions of polysilicon layer 14 and oxide layer 12 may be etched to the underlying silicon substrate 10 using, for example, a dry, plasma etch. Etch duration is selected to terminate a pre-determined distance below the surface of polysilicon layer 14 before substantial surface portions of the substrate can be etched away. Exposed regions 22 and 24 are confined within active areas between gate conductor 18 and a field oxide (not shown). The resulting gate conductor 18 has relatively vertical opposed sidewall surfaces 20. Gate oxide 16 is interposed between substrate 10 and gate conductor 18. Regions 22 and 24, henceforth referred to as junction regions, are spaced apart by gate oxide 16 and gate conductor 18, although junctions are not formed until ions are actually forwarded therein.

Figure 3:
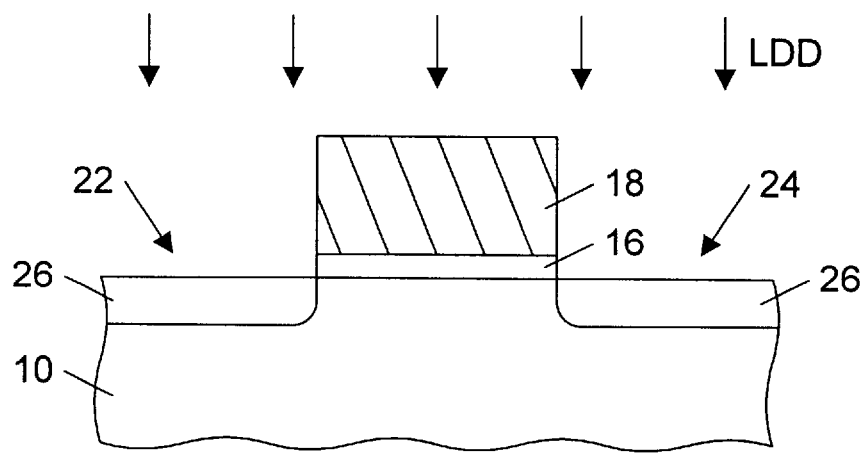
FIG. 3 is a cross-sectional view of the semiconductor topography, wherein a first dopant is implanted into the pair of junctions to form LDD areas, subsequent to the step in FIG. 2.
Figure 4:
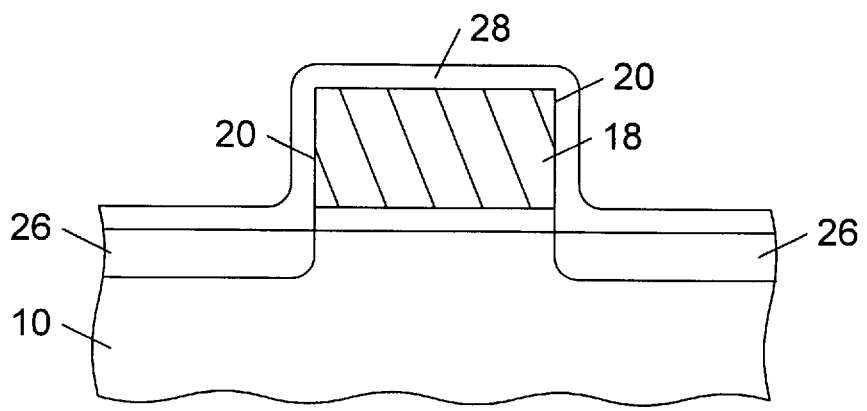
FIG. 4 is a cross-sectional view of the semiconductor topography, wherein an etch stop material is formed across the pair of junctions and the gate conductor, subsequent to the step in FIG. 3.

As illustrated in FIG. 3, a first dopant implant, i.e., an LDD implant, may then be forwarded into junction regions 22 and 24 to form LDD areas 26 within an upper portion of substrate 10. As depicted in FIG. 4, an etch stop material 28 may be grown or deposited across junction regions 22 and 24 and gate conductor 18. Etch stop material 28 is preferably a material that etches at a slower rate than an overlying, subsequently formed spacer material. In this embodiment, etch stop material 28 is composed of oxide. Etch stop thickness is pre-selected such that it is not penetrated during removal of the overlying spacer material.

Figure 5:
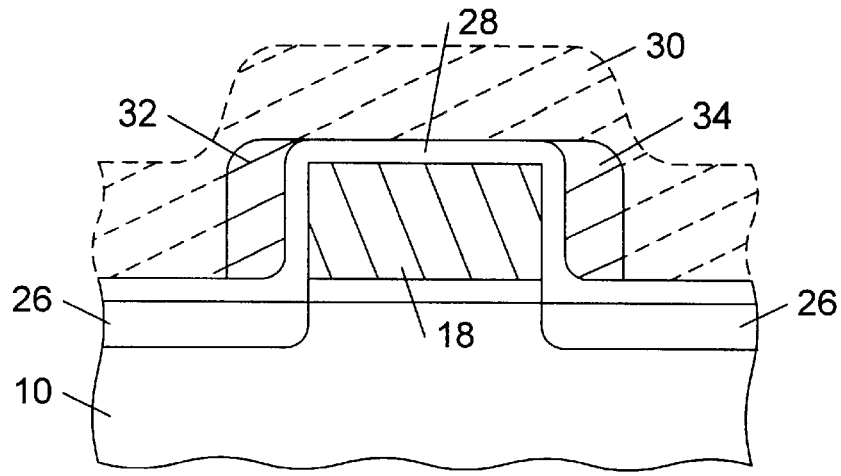
FIG. 5 is a cross-sectional view of the semiconductor topography, wherein nitride spacers are formed laterally adjacent to the etch stop material arranged upon opposed sidewall surfaces of the gate conductor, subsequent to the step in FIG. 4.

FIG. 5 illustrates the deposition and partial removal of a spacer material 30 across etch stop material 28. Spacer material 30 is preferably composed of chemical vapor deposited nitride. After its deposition, spacer material 30 is removed using the "anisotropic" etch process at a faster rate along horizontal surfaces than vertical surfaces. Etch duration is terminated, however, before the entirety of material 30 is removed. Thus, material 30 is retained primarily on vertical surfaces of etch stop material 28 adjacent sidewall surfaces 20 of gate conductor 18. The retained portions form spacers 32 and 34. Etch duration is chosen to last until the lateral thickness of the spacers sufficiently masks portions of junction regions 22 and 24 near the channel.

Figure 6:
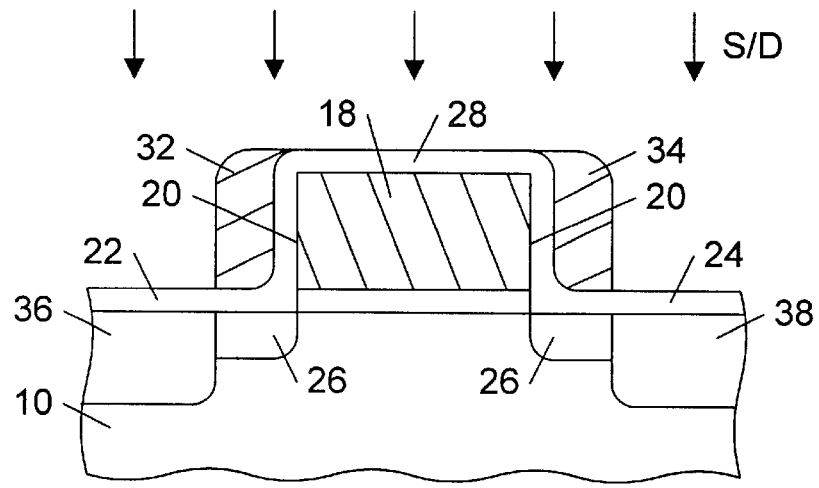
FIG. 6 is a cross-sectional view of the semiconductor topography, wherein a second dopant is implanted into exposed portions of the pair of junctions to form heavily doped source and drain regions, subsequent to the step in FIG. 5.

Turning to FIG. 6, a heavily doping source/drain ("S/D") implant is forwarded to exposed areas of junction regions 22 and 24 and to gate conductor 18. The dopants implanted may be n-type dopants or p-type dopants, depending on the desired type of transistor. Some commonly used n-type dopants are arsenic or phosphorus, and some commonly used p-type dopants are boron or boron difluoride. The S/D implant is self-aligned to exposed lateral surfaces of spacers 32 and 34. Thus, a drain region 36 and a source region 38 are formed within substrate 10 on opposite sides of gate conductor 18. Each of the regions 36 and 38 is spaced from one of the sidewall surfaces 20 by the lateral thickness of one spacer and the lateral thickness of the etch stop material adjacent to the sidewall surface.

Source and drain regions 36 and 38 overlap and dominate portions of previously formed LDD areas 26. The remaining regions of LDD areas 26 are defined exclusively between the channel (below gate conductor 18) and regions 36 and 38. Since source and drain regions 36 and 38 are heavily concentrated with dopants and LDD areas 26 are lightly concentrated with dopants, together they form graded source-side and drain-side junctions. Source and drain regions 36 and 38 exhibit net low resistivity regions on which a contact can be reliably made. The dopant concentration of source and drain regions 36 and 38 is chosen to effectuate whatever threshold voltage and junction resistance/capacitance is needed to operate the ensuing transistor within desired design specification.

Figure 7:
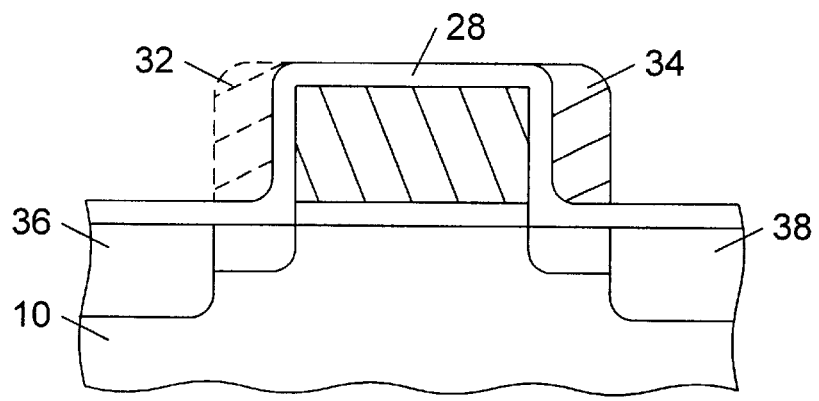
FIG. 7 is a cross-sectional view of the semiconductor topography, wherein the drain-side spacer is removed, subsequent to the step in FIG. 6.

Turning to FIG. 7, the drain-side spacer 32 may be removed from etch stop material 28. Accordingly, the wet etch composition is one which etches spacer 32 (i.e., silicon nitride) to a much greater extent than the underlying etch stop material 28 (i.e., silicon dioxide). A photoresist masking layer (not shown) may be placed across the source-side spacer 34, thereby preventing its removal. According to one example, silicon nitride material can be etched by reflux boiling phosphoric acid at an elevated temperature. Using this procedure, an etch rate of nitride to underlying thermally grown oxide is at least 4:1.

FIGS. 8a, 9a, and 10a, illustrate one embodiment of the steps used to complete the formation of a transistor having reduced HCE. As depicted in FIG. 8a, the semiconductor topography may be subjected to thermal radiation 42. This annealing step is preferably performed using Rapid Thermal Processing ("RTP") which provides for anneal implantations with minimal impurity redistribution. Since most as-implanted impurities do not occupy substitutional sites, this thermal step is employed to bring about electrical activation of the implanted dopants. Furthermore, primary crystalline defect damage that occurs mainly during light ion implantation is substantially reordered and thereby removed by this annealing step. For instance, vacancies and self-interstitials that are in close proximity undergo recombination, and thus remove trapping defects.

Turning to FIG. 9a, another annealing step may be performed at a lower temperature than the previous annealing step. The semiconductor topography may be placed in a chamber 40 into which barrier-entrained gas may pass. While in chamber 40, the semiconductor topography is preferably exposed to thermal energy 42 to cause the barrier atoms to migrate from the gaseous material to a lateral area under the drain-side of gate oxide 16. More specifically, migration occurs through etch stop material 28 to areas of disruption comprising irregular bonds, dangling bonds, or layer junctures where abrupt changes in bond organization occur. After reaction has occurred, the barrier-entrained gas is evacuated from chamber 40, allowing the chamber to be opened and the wafer to be removed. According to one embodiment, the barrier-entrained gas comprises nitrogen and oxygen in varying proportions. As such, nitrogen is incorporated into a critical area under gate oxide 16 near the drain-side region. Since nitrogen atoms migrate at a faster rate than impurity atoms, a lower temperature is used in this step to prevent nitrogen from diffusing too far below the surface of substrate 10. The previous annealing step required a higher temperature to mobilize the relatively heavy dopant atoms.

The combination of spacer 34 and etch stop 28 substantially prevents the barrier atoms from entering source-side LDD area 26 and the channel region beneath gate conductor 18 in close proximity to source-side LDD area 26. Absent spacer 32, the critical area within drain-side LDD 26 and at the interface between the channel and drain-side LDD 26 receives the barriers. Barrier atoms also migrate somewhat to the interface between the channel, near the drain-side, and the gate oxide adjacent the channel. The interfacial defects at the channel/gate oxide make this area particularly receptive to receiving and retaining the barrier atoms. It is believed that spacer 34 serves therefore to mask barrier atoms from unnecessarily entering the junction in regions directly below the spacer.

Turning now to FIG. 10a, a detailed view along region 44 of FIG. 9a is shown. Barrier atoms 46 (e.g., nitrogen) are located within drain-side LDD area 26, and particularly at the gate oxide 16 and channel interface near the drain area. It is contemplated that atoms 46 migrate mostly through etch stop material 28 and accumulate at bond disruption sites. Those sites occur mostly at the juncture between thin films and, importantly, predominantly at the juncture between gate oxide 16 and substrate 10. The high mobility of the relatively small nitrogen atoms 46 readily bond with various bond opportunities at those disruptions. Bonding of nitrogen serves to block or "plug" the migration pathways into gate oxide 16 and to minimize hot carrier trap opportunities within gate oxide 16. As such, hot carriers sourced from the drain side of LDD area 26 are substantially prevented from entering and being trapped within gate oxide 16. Minimization of hot carrier injection and entrapment is achieved by the barrier characteristics of atoms 46, as shown by reference numeral 48.

Figure 8B:
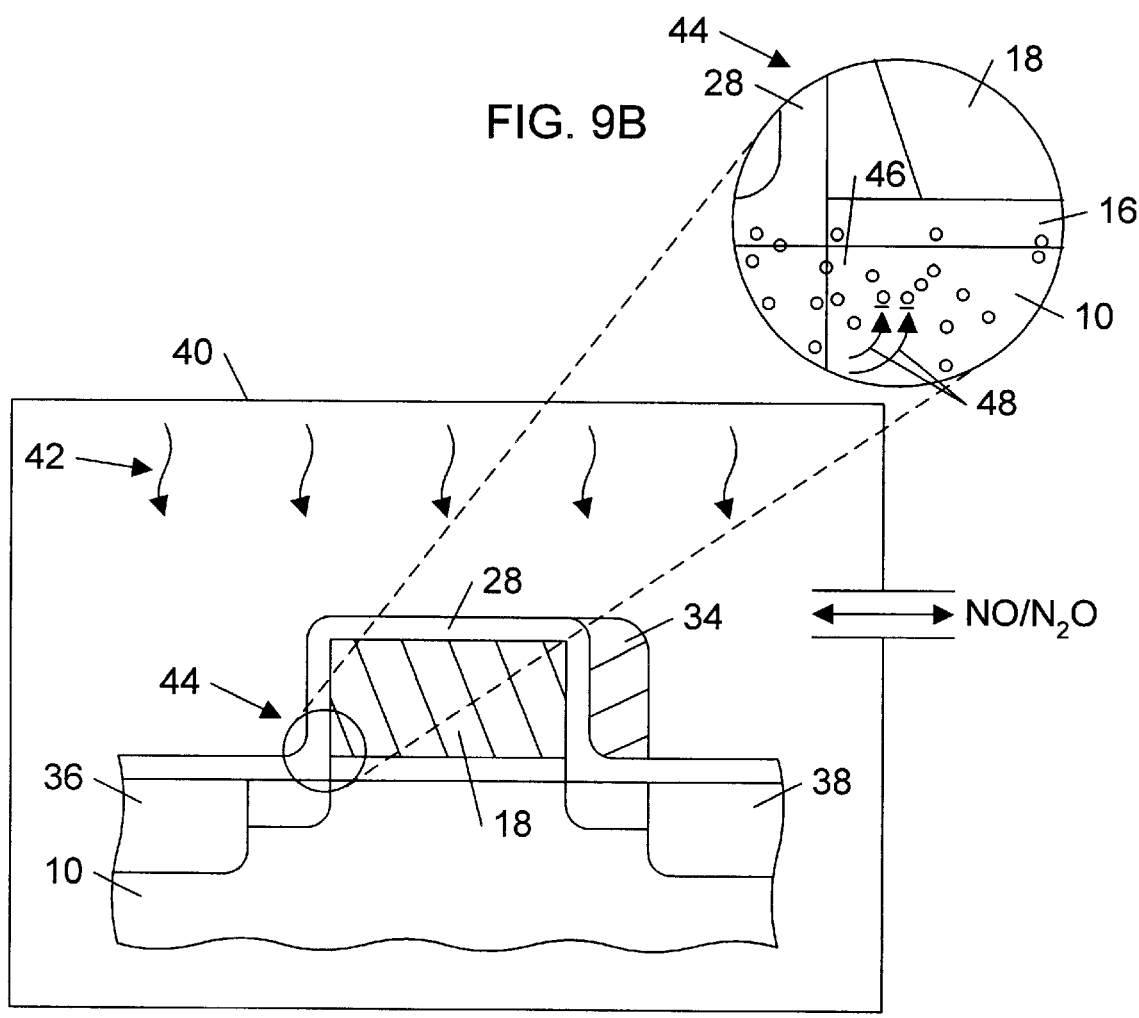
FIG. 8b is a cross-sectional view of the semiconductor topography, wherein the semiconductor topography is only subjected to thermal radiation in an ambient containing barrier atoms according to another embodiment, subsequent the step in FIG. 7.

FIGS. 8b and 9b illustrate another embodiment of the present invention in which only one annealing step is performed. The semiconductor topography is simultaneously exposed to thermal radiation 42 and to barrier-entrained gas. A high temperature is used in order to electrically activate impurity atoms, annihilate crystalline defect damage, and drive barrier atoms from the gas into substrate 10. FIG. 9b illustrates a portion 44 of FIG. 8b in more detail. The main difference between the embodiment shown in FIG. 9b and that shown in FIG. 10a is that the bulk of barrier atoms 46 (nitrogen) are located further below the surface of substrate 10. The higher temperature causes barrier atoms 46 to migrate to a greater depth. Barrier atoms 46 thusly placed prevent hot carriers from approaching gate oxide 16, thereby reducing hot carrier injection and trapping within gate oxide 16, as shown by reference numeral 48. It is desirable that barrier atoms do not migrate below LDD area 26 since the hot carriers mainly enter gate oxide 16 from the drain-side LDD area. If very few barrier atoms exist laterally adjacent to drain-side LDD area 26, then hot carrier injection may still be a problem.

FIGS. 8c, 9c, and 10c illustrate yet another embodiment of the present invention. As shown in FIG. 8c, the semiconductor topography is subjected to a high temperature anneal in the form of thermal radiation 42. A high temperature is used in order to electrically activate impurity atoms and to annihilate crystalline defect damage. FIG. 9c illustrates ion implantation of barrier ions, preferably nitrogen ions, into the semiconductor topography. Acceleration of the ions may be controlled so as to move the ions into the critical area beneath gate oxide 16, near the drain. FIG. 10c illustrates a portion 44 of FIG. 9c in more detail. Ion implantation advantageously provides for better control of the depth at which atoms 46 become located. Nitrogen of small atoms might readily migrate in a lateral demeanor slightly toward the channel and therefore are unable to achieve great depth below gate oxide 16. Thus, there is no danger of barrier atoms 46 migrating too far below the surface of substrate 10. In fact, barrier atoms 46 are located strategically at the gate oxide/substrate interface adjacent to drain-side LDD area 26. Barrier atoms 46 thusly placed block the migration pathways of hot carriers, as shown by reference numeral 48, thereby preventing hot carriers from approaching and becoming trapper within gate oxide 16.

It is preferred, regardless of the fabrication steps used, that the barrier atoms exist at locations within the drain-side LDD, drain-side LDD/channel and the channel/gate oxide near the drain, to effectively block migration of hot carriers to trap sites within the gate oxide. If the barrier atoms are driven deep below the substrate surface, there may be an opportunity for hot carriers to traverse into the gate oxide from a region shallower than the majority of barrier atoms. The single step anneal temperature must therefore be carefully controlled relative to the desired depth at which the barrier atoms finally reside. It is preferred that the anneal be chosen to place the peak concentration density of barrier atoms between, for example, 0.1 to 0.3 $\mu$m. A two step anneal appears beneficial in that the desired profile constraints of a heavier n- or p-type post implant anneal will not affect a subsequent, lighter barrier anneal. The one step anneal followed by ion implantation is advantageous because the depth at which the barrier atoms come to rest is more tightly controlled by adjusting ion acceleration energies. Further, the one step anneal does not affect the subsequent ion implantation. Both the anneal/ion implantation process and the two step anneal process can therefore be chosen to optimally place the barrier atoms in diffusion and migration avenues between the drain region and the gate oxide proximate the drain region.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for forming a transistor, comprising:
providing a gate dielectric interposed between a silicon substrate and a gate conductor, said gate conductor being defined between a pair of opposed sidewall surfaces, and further providing a first exposed region and a second exposed region of said silicon substrate, said first exposed region being spaced from said second exposed region by said gate dielectric;
implanting a first dopant into said first exposed region and said second exposed region to form lightly doped drain areas within said silicon substrate;
forming an etch stop material upon said pair of sidewall surfaces to a first pre-defined thickness;
forming a pair of spacers upon said etch stop material to a second pre-defined thickness, thereby covering select portions of said first exposed region and said second exposed region;
implanting a second dopant into said first exposed region and said second exposed region exclusive of said select portions, thereby forming source and drain areas within said silicon substrate;
removing one of said pair of spacers from said etch stop material in close proximity to said drain area, thereby exposing the etch stop material; and
incorporating barrier atoms into an area of said semiconductor substrate adjacent said drain area and beneath a portion of said gate dielectric.

2. The method as recited in claim 1, wherein said second dopant is implanted at a higher concentration and at a higher energy than said first dopant.

3. The method as recited in claim 1, wherein said source area is a spaced distance from said gate dielectric, said spaced distance being substantially equal to said first pre-defined thickness combined with said second pre-defined thickness.

4. The method as recited in claim 1, wherein said drain area is a spaced distance from said gate dielectric, said spaced distance being substantially equal to said first pre-defined thickness combined with said second pre-defined thickness.

5. The method as recited in claim 1, wherein said lightly doped drain areas are spaced apart by said gate conductor.

6. The method as recited in claim 1, wherein said barrier atoms are nitrogen atoms.

7. The method as recited in claim 6, wherein said incorporating comprises heating said semiconductor topography concurrent with forwarding said nitrogen atoms from a nitrogen-bearing ambient substantially through said exposed etch stop material and into said lateral perimeter portion to minimize hot carriers from entering said gate dielectric.

8. The method as recited in claim 1, wherein said incorporating comprises implanting nitrogen ions into said lateral perimeter portion.

9. The method as recited in claim 1, wherein said first and second dopants are n-type dopants.

10. The method as recited in claim 1, wherein said first and second dopants are p-type dopants.

11. The method as recited in claim 1, wherein said gate conductor is patterned from a layer of polycrystalline silicon.

12. The method as recited in claim 1, wherein forming said etch stop material comprises chemical vapor depositing an oxide across said pair of sidewall surfaces.

13. The method as recited in claim 1, wherein forming said spacer comprises:

depositing a layer of nitride upon said source and drain regions and said gate conductor; and anisotropically removing said layer of nitride except upon said etch stop material.

* * * * *